ULTRA-HIGH-FREQUENCY BACKWARD WAVE OSCILLATOR-KLYSTRON TYPE AMPLIFIER TUBE

Filed April 16, 1962 2 Sheets-Sheet 1

Inventor
M. KENMOKU
By Arthur M. Lieberman
AGENT

Dec. 13, 1966 MASAMICHI KENMOKU 3,292,033

ULTRA-HIGH-FREQUENCY BACKWARD WAVE OSCILLATOR-KLYSTRON TYPE AMPLIFIER TUBE

Filed April 16, 1962 2 Sheets-Sheet 2

Inventor
M. KENMOKU
By Arthur M. Lieberman
AGENT

United States Patent Office 3,292,033
Patented Dec. 13, 1966

3,292,033
ULTRA-HIGH-FREQUENCY BACKWARD WAVE OSCILLATOR-KLYSTRON TYPE AMPLIFIER TUBE

Masamichi Kenmoku, Minato-ku, Tokyo, Japan, assignor to Nippon Electric Company, Limited, Tokyo, Japan, a corporation of Japan Filed Apr. 16, 1962, Ser. No. 187,658
Claims priority, application Japan, Apr. 22, 1961, 36/14,472
6 Claims. (Cl. 315—3.6)

This invention relates to an ultra-high-frequency namely so-called microwave oscillator tube, and more particularly to such a tube composed mainly of a portion for producing a backward-wave oscillation (to velocity-modulate the electron beam), and cavity resonator means for resonating with the high frequency component of the velocity-modulated electron beam (to perform the bunching).

As oscillator tubes whose frequency is easily variable, use has chiefly been made of reflex type velocity modulation tubes, namely reflex klystrons, and backward-wave oscillators. In a reflex klystron, the oscillation frequency is controlled, as is well-known, by adjusting the voltage of the repeller and the dimensions of the cavity resonator. In the reflex klystron, however, the linearity between the change in the repeller voltage and the change in the oscillation frequency is not good. Moreover, the range of the oscillation frequency is narrow, and liable to change with temperature. With a backward-wave oscillator, it is possible to produce an oscillation of relatively stable frequency, but it is difficult to make the output power large. Furthermore, it is necessary to provide a relatively high power voltage-stabilized direct-current source in order to operate a reflex klystron or a backward-wave oscillator tube; with the result that there is an increase in the cost of the UHF transmitter per unit watt of output power.

On the other hand, it has recently become desirable, in order to facilitate the maintenance of UHF channels which run through Japan, to install unattended repeaters. Furthermore, it has become preferable to make these repeaters even more self-sufficient by utilizing solar batteries as the power source. The cost would, however, be enormous to operate known reflex type velocity-modulation tubes, or backward-wave oscillator tubes, with such a power source because of the bulky mass of solar batteries that would be necessary. This cost, on the other hand, could be reduced if the efficiency of the variable frequency oscillator tube in the transmitter could be increased.

Hence, the objective of this invention is to provide an ultra-high-frequency oscillator tube of high efficiency and stability which is void of the above-mentioned defects found in reflex type velocity modulation tubes and backward-wave oscillators.

The above mentioned and other features and objects of this invention and the manner of attaining them will become more apparent and the invention itself will best be understood by reference to the following description of several embodiments of the invention taken in conjunction with the accompanying drawings wherein.

Figures 1, 2, 3:
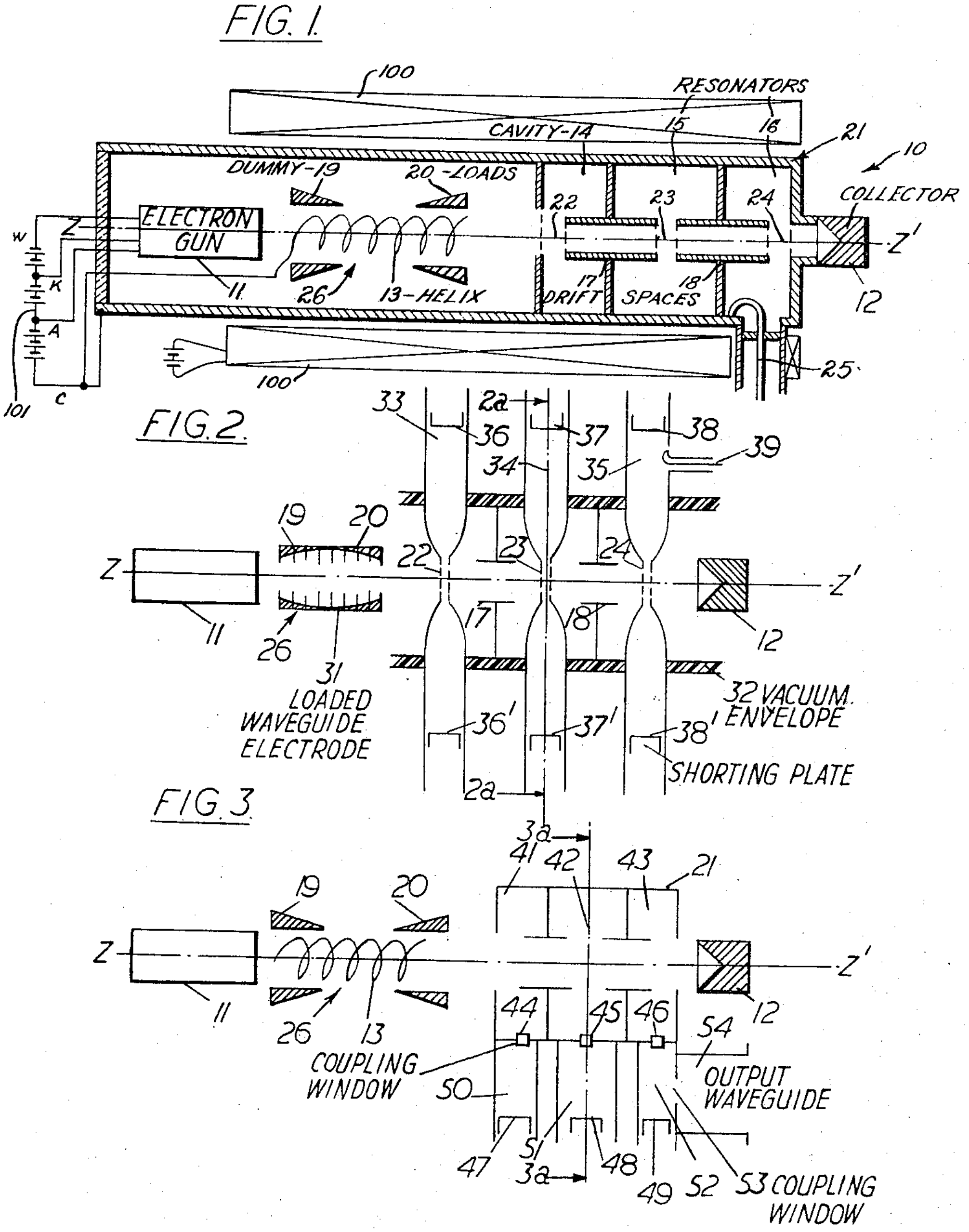
FIG. 1 illustrates schematically an axial section of an ultra-high-frequency oscillator tube according to the invention.
FIGS. 2 and 2(*a*) illustrate schematically an axial and cross section, respectively, of a second embodiment of the invention wherein, among other things, movable shorting plates are provided the resonators.
FIGS. 3 and 3(*a*) illustrate schematically an axial and cross section, respectively, of a third embodiment of the invention wherein, among other things, additional variable cavity resonators are provided the fixed resonators.
Figure 2A:
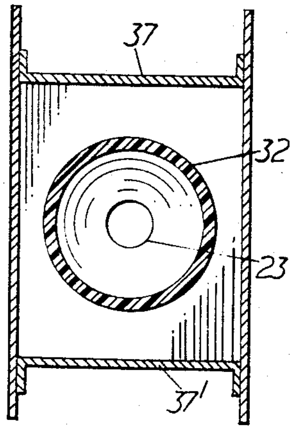
Figure 3A:
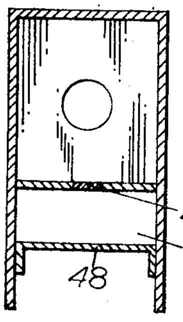

Referring now to FIG. 1 which is a schematic axial section of an ultra-high-frequency oscillator tube according to the invention, it will be understood that the electrons emitted from electron gun 11 are caused to travel along axis Z–Z′, in a beam-like pattern, by magnetic focussing means 100 and are collected at a collector electrode 12. Included in block 11, which as noted heretofor indicates the electron gun, is a focussing electrode. One end of the direct current supply means 101 marked W is connected to said focussing electrode; and the other end of said supply means marked C is connected to the collector electrode. Two intermediate taps of said direct current supply means 101 are connected to supply the cathode (from the tap K) and the anode (from the tap A) respectively. Disposed concentrically about the axis Z–Z′, a helical electrode 13 (which is known from the conventional backward-wave oscillator tube) and cavity resonators 14, 15, and 16 (which will be explained hereafter) are arranged in succession from the electron gun 11. Disposed between the cavity resonators 14 and 15, and 15 and 16, are drift tubes 17 and 18, respectively. The helical electrode 13 is equipped, at both ends thereof, with dummy loads 19 and 20 (which are similar to those found in the attenuators of a helical electrode of a conventional travelling-wave tube), so that only the single wave component of the high-frequency backward-wave energy produced in the helical electrode 13 may survive, and other composite wave components thereof may undergo attenuation. The cavity resonators 14, 15, and 16 are of the same construction as those of the so-called rectilinear multi-stage klystron and serve to amplify the desired fundamental frequency component of the electron beam modulated at the helical electrode 13. Hence, the rectilinear multi-stage klystron portion, may be termed an amplifying portion 21. Gaps 22, 23, and 24 are formed around the axis of the cavity resonators 14, 15, and 16, respectively, for coupling the high-frequency component included in the electron beam with the cavity resonators. The first and second stage cavity resonators 14 and 15 have no input or output, but the last-stage cavity resonator 16 is equipped with an output lead 25 for taking out therethrough the output power of the complete oscillator tube.

The operation of the oscillator tube will now be briefly explained. During passage of the electron beam, emitted from the electron gun 11, through the backward-wave oscillator portion 26 high-frequency energy, whose phase and group velocities are in opposite directions, is induced in the helical electrode 13. The high frequency energy in turn velocity-modulates the flow of the electron beam. When the modulated electron beam reaches the gap 22 of the first cavity resonator 14, the high-frequency component contained therein resonates the cavity 14 inducing an amplified voltage thereacross. The amplified voltage remodulates the beam inducing a more strongly bunched beam in the drift tube 17. This is repeated at the next two cavities. Thus, the high-frequency component is amplified. It will be understood from the foregoing that the relation between the induction and bunching coactions of the beam and the gaps, subsequent to the gap 22, is similar to the case of a rectilinear multi-stage klystron. The high-frequency component thus amplified by the amplifying portion 21 is taken out through the coaxial cable 25 connected with the last-stage cavity resonator 16.

In this embodiment, there are three stages of cavity resonators in the rectilinear multi-stage klylstron portion 21. The stages, however, may be five or six. It is also possible by slightly detuning an intermediate resonator to broaden the band width. In these respects, the embodiments to be later described are all the same. The oscillation frequency can be changed by varying the direct-current voltage supplied to the helical electrode 13, of the backward-wave oscillator portion 26, as is known with respect to conventional backward-wave oscillator tubes. Increasing and decreasing the voltage of the helical electrode 13 results in an increase and decrease in the oscillation frequency, respectively. In order to follow the frequency change obtained by the adjustment in the control voltage, it is necessary to adjust the resonance frequency of the cavity resonators 14, 15, and 16 by means which will later be described.

Referring to FIG. 2, a second embodiment of the invention is shown, having an electron gun 11, a collector electrode 12, and drift tubes 17 and 18 which are similar to those parts of FIG. 1 designated by like numerals. For the slow wave circuit of the backward-wave oscillator portion 26, a loaded waveguide type electrode 31 is provided instead of the helical electrode 13 of the embodiment shown in FIG. 1. The amplifying portion 21 is provided by cavity resonators 33, 34, and 35 which have walls disc-sealed to a refractory insulator, such as glass, of the vacuum envelope 32. In this type of cavity resonator, the resonant frequency can be adjusted by means of the movable short-circuiting plates 36, 37, 38, 36′, 37′, and 38′. Furthermore, it is possible with this embodiment to do without the magnetic focussing means for the multi-stage klystron amplifier portion 21, because it is possible to form electron lenses between the gaps 22, 23, and 24 and the drift tubes 17, 18, and 19. The output of the amplifying portion 21 can be taken through an output terminal 39 coupled to the last-stage cavity resonator 35.

The operation of the oscillator tube 30 is the same as that shown in FIG. 1 and so will not be explained any further. Although the electrode 31 consituting the slow wave circuit of the backward-wave oscillator portion 26 is shown in a form of a loaded waveguide, it may be constituted by a helical electrode as in the case of the embodiment of FIG. 1.

FIG. 2(*a*) shows the cross section of the oscillator tube, taken on line 2*a*—2*a*, viewed in the direction of the arrows shown in FIG. 2. Although the cross section is only of the cavity resonator 34, the cross section of the other cavity resonators 33 and 35 are similar. As shown, the cavity resonators are rectangular and the resonance frequency thereof can be adjusted by properly displacing the short-circuiting plates 37 and 37′.

Although both of the paired short-circuiting plates are made movable in the case of the oscillator tube shown in FIGS. 2 and 2(*a*), one of them may be fixed.

Referring now to FIG. 3 which shows an axial section of a third embodiment of the invention, the electron gun 11, the collector electrode 12, the helical electrode 13, and the dummy loads 19 and 20 are similar to the corresponding parts of the first embodiment shown in FIG. 1 and are designated with like numerals. In this embodiment additional cavity resonators 50, 51, and 52 are coupled with cavity resonators 41, 42, and 43 through coupling windows 44, 45, and 46, respectively, and are provided with short-circuiting plates 47, 48, and 49 which are movable perpendicularly to the axis of the cavity resonators 41, 42, and 43, respectively. With large coupling windows and consequent large coupling between the cavity resonators, it is possible to vary the resonance frequencies in considerably wide ranges. The output of the amplifying portion 21 is taken by means of an output waveguide 54 through another coupling window 53 of the resonator 52 which in turn is coupled to the last-stage cavity resonator 43. In this embodiment, it is also possible to use a loaded waveguide as the slow wave circuit. Also, it is possible to use, with appropriate modification, a coaxial cable or the like, in place of the waveguide for the output.

FIG. 3(*a*) shows the cross section of the oscillator tube taken on line 3*a*—3*a*, viewed in the direction of the arrows shown in FIG. 3. As will be understood from this cross-sectional view, the cavity resonators 42 and 51 which together form a double cavity resonator are shaped in the form of rectangular parallelepipeds, and the resonance frequency of the double cavity can be varied by means of the movable short-circuiting plate 48 which changes the volume of the cavity resonator 51.

Figures 4, 6:
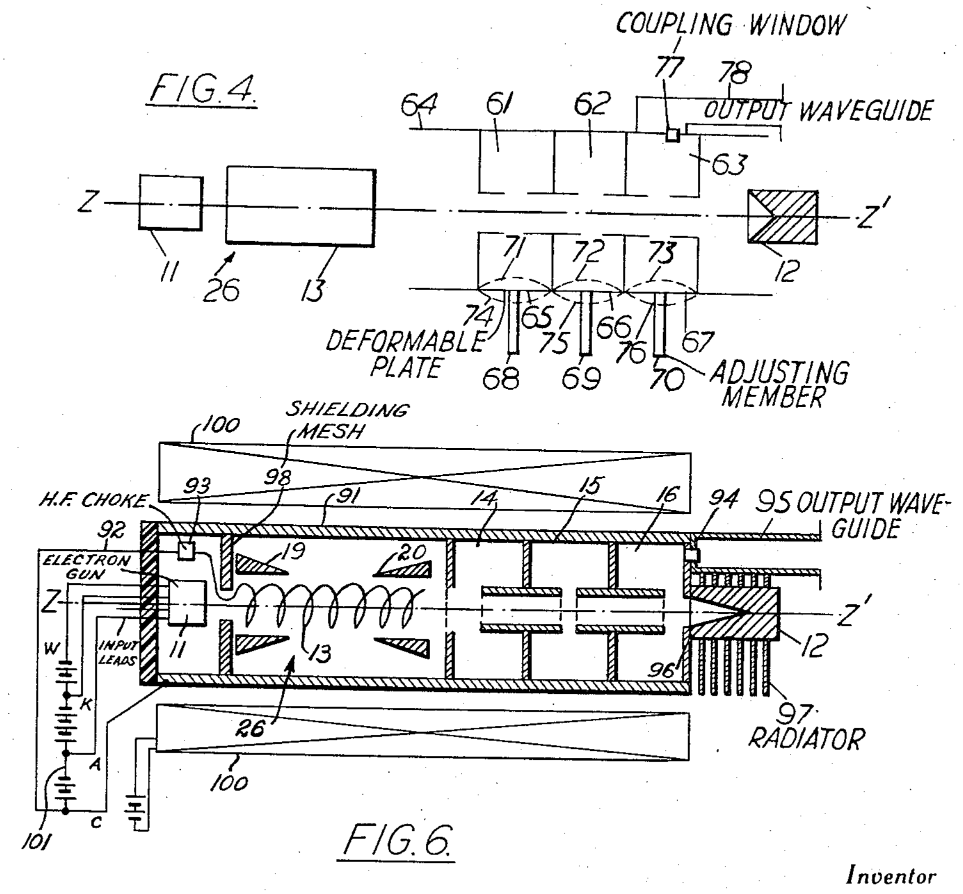
FIG. 4 illustrates an axial section of a fourth embodiment of the invention where the resonators are provided deformable plates.
FIG. 6 shows an axial section of a complete UHF tube, according to the invention, including both the leads and the envelope.

FIG. 4 shows a fourth embodiment of the invention. The parts which have already been described with reference to FIGS. 1–3 are shown in block form with like parts being designated with like numerals. In the oscillator tube of this embodiment, lateral wall 64 of three-stage cavity resonators 61, 62 and 63 serves also as the vacuum envelope. A part of this wall 64 is composed of mechanically deformable metal plates 65, 66, and 67, such as thin copper plates, or iron plates plated with copper, so that the resonance frequencies may be varied. These plates are movable by means of frequency adjusting numbers 68, 69, and 70. Means for moving the members 68, 69, and 70 are not shown in the drawing since such means are well known in the UHF art. Dotted lines 71, 72, 73 and 74, 75, 76 show the positions of the metal plates at minimum and maximum volumes of the cavity resonators, respectively. The output of the last-stage cavity resonator 63 is taken through an output waveguide coupled thereto by a coupling window 77. The output waveguide may be replaced as before by a coaxial cable.

Figure 5:
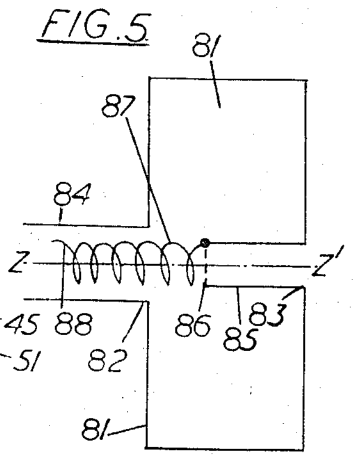
FIG. 5 shows a modification of the first stage cavity resonator.

FIG. 5 shows a preferred modification of a resonator to be used as the first-stage cavity resonator of the amplifying portion 21 in any of the oscillator tubes shown in FIGS. 1–4. In this modification, it is again assumed that the electron beam travels from left to right. A metal tube 84 whose diameter is considerably larger than that of the electron beam and another metal tube or drift tube 85 which is only slightly larger in diameter than the electron beam are attached to a cavity resonator 81 at an entrance window 82 and an exit window 83, respectively. Drift tube 85 protrudes towards the source of the electron beam so that a gap 87 may be formed between the entrance window 82 and tip 86 of the drift tube. Furthermore, a helix 88 whose diameter is substantially equal to that of the drift tube 85 is fixed to the tip 86 of the drift tube so that the free end portion of the helix may be in coaxial relation to the larger tube 84. The electron beam, which is caused to have high-frequency component by the above-mentioned backward-wave oscillator portion 26, is coupled with the cavity resonator 81 by virtue of the helix 88. Therefore, the bunching action of the cavity resonator 81 is remarkably enhanced. The tube 84 is for the purpose of amplifying the above-mentioned effect of the helix 88. If the axial length of the tube 84 is longer than the helix, it is possible to prevent the high-frequency component of the electron beam from radiating out of the cavity resonator, and to make the coupling between the electron beam and the helix 88 closer. The helix 88 may be supported in the tube 84 by means of electrical insulators (not shown) such as, for example, three quartz rods disposed parallel to the axis Z–Z′ between the helix and the tube.

FIG. 6 shows schematically an axial section of a complete ultra-high-frequency oscillator tube according to the invention with all of the electrodes of the embodiment shown in FIG. 1 being enclosed in a vacuum envelope 91. As in conventional travelling-wave tubes, the electron gun 11 and the collector 12 may be directly connected by means of a female socket member to the power sources. The D.C. control voltage for varying the oscillation frequency is supplied to the helical electrode 13 from one of pins 92 (also arranged to contact the socket) through a high-frequency choke 93. This choke prevents the leakage of the high-frequency energy produced at the backward-wave oscillator portion 26 and reduces the affect of an external impedance. In order to further prevent the leakage of the high-frequency energy, a shielding mesh wall 98 is positioned between the electron gun 11 and the helical electrode 13. The cavity resonators 14, 15, and 16 have already been described with reference to the embodiment of FIG. 1. The output of the last-stage cavity resonator 16 is taken through a coupling window 94 by means of output waveguide 95. As has been described, the waveguide 95 may be replaced, with proper modification, by a coaxial cable or the like. The collector electrode 12 is fixed at 96 to the metal cover of the last-stage cavity resonator 16, and is equipped with a radiator 97 for heat dissipation. On operating the oscillator tube of the embodiment, a magnetic focussing means 100 is placed around the envelope 91. The intensity of the magnetic field is determined so as to minimize the electron current impinging upon the helical electrode 13. As will be clearly understood from the construction of the oscillator tube, the collector electrode 12 may be fixed directly to the last-stage cavity resonator, without leaving a space therebetween; with the result that the oscillator tube is simple in construction and rigid in mechanical strength. The end of the direct current supply means 101 marked C is connected to the collector as shown. Taps K and A of said supply means are respectively connected to the cathode and the anode and the tap W is connected to the focussing electrode which is generally included in block 11 indicating the electron gun.

Moreover, the oscillator tube of the invention possesses the advantages inherent in a backward wave oscillator in that it has a substantial linear relationship between the control voltage and oscillation frequency, while it operates at an efficiency comparable to a multi-cavity klystron (20–40% at CW) in its amplifier stage; the operation being stable even with an unmatched load. This compares very favorably with a klystron which has a disadvantageous nonlinearity, and with a backward wave oscillator where the efficiency is only several percent for CW operation, and the frequency is unstable when the load varies. Inasmuch as the linearity and efficiency are excellent, the oscillator tube is quite suitable for use in ultra-short wave supermulti-channel communication and color television broadcasting.

Also, it is well known that in a conventional reflex klystron the major portion of the consumed direct-current power brings about an undesirable effect by raising the temperature of the cavity resonator. This is due to the fact that the electron current emitted from the electron gun is captured by the cavity resonator. In the oscillaor tube of the invention on the other hand, the major portion of the electron current is captured by the collector electrode, with the result that the oscillator tube is well adapted for a large power operation by providing for the dissipation of heat from this electrode. Hence, it is possible to avoid the change in the oscillation frequency which would otherwise be caused by the heating up of the cavity resonator. Moreover, in the invention the oscillation frequency is not directly determined by the cavity resonators themselves, but rather by the direct-current control voltage of the backward-wave oscillator portion which is separate from the cavity resonators. Thus, the oscillation frequency does not vary even if the dimensions of the cavity resonator are caused to change due to the affect of the temperature thereof and, therefore, it is possible to do without a temperature compensation means, (which has hitherto been indispensable and the whole construction of the oscillator may be simplified.

If the oscillator tube of the invention is operated with the electron beam fully focussed and sufficiently larger than the critical value necessary for producing the backward-oscillations, oscillation is continued even if there is a varition in the electron emissivity. Inasmuch as the rectilinear multi-stage klystron amplifying portion has, as is well-known, characteristics such that the output level is saturated if the input power exceeds a predetermined level, an output oscillation of very stable power is obtained provided that the electron beam is fully modulated at the backward-wave oscillator portion.

In the above-described embodiments, the dummy loads provided at both ends of the slow wave structure of the backward-wave oscillator portion may be replaced by absorbers disposed outside of the vacuum envelope. Also, the electrode of the backward-wave oscillator portion, and the multi-stage cavity electrodes of the amplifying portion may be ohmicly connected within the oscillator tube, while the collector electrode is maintained separate. Furthermore, the high-frequency component produced at backward-wave oscillator portion may be taken out of the oscillator tube, within a range in which there is little to no variation in frequency and output level, for adjusting the oscillation. Likewise, each stage of the multi-stage klystron amplifying portion may be provided with an output circuit for coupling out, within a range in which there is little to no variation in frequency and output level of the oscillation; or an input circuit may similarly be provided for applying control voltages for adjusting the resonance frequency of each stage of the cavity resonators.

While I have described above the principles of my invention in connection with specific apparatus, it is to be clearly understood that this description is made only by way of example and not as a limitation to the scope of my invention, as set forth in the objects thereof and in the accompanying claims. Furthermore, the word "UHF" used herein and in the accompanying claims means also the so-called microwave frequencies.

What is claimed is:

1. An ultra high frequency oscillator tube in which a focussed beam of electrons from an electron gun is emitted substantially coaxial with the tube axis, the combination which comprises a slow backward wave oscillator portion coupled to said beam of electrons for producing a high frequency velocity modulated backward wave oscillation; and a klystron type amplifier portion connected in tandem with said oscillator portion, said amplifier portion including a plurality of cavity resonators serially disposed about said velocity modulated beam for amplifying a high frequency oscillation component of said beam, means for collecting said beam, and means coupled to the last resonator cavity for extracting the amplified high frequency oscillation component.

2. An ultra high frequency oscillator tube as claimed in claim 1 in which said slow wave structure comprises a helix.

3. An ultra high frequency oscillator tube as claimed in claim 1 in which said means coupled to the last of said plurality of cavity resonators comprises a waveguide coupled through a window in said last resonator.

4. An ultra high frequency oscillator as claimed in claim 1 in which electron drift means are serially disposed between adjacent cavity resonators of said klystron type amplifier portion.

5. An ultra high frequency oscillator tube as claimed in claim 4 further comprising a metal tube coaxial to and larger in diameter than the electron beam attached to and extending from the first of said plurality of cavity resonators toward the slow wave structure, and a helix disposed within and extending through said metal tube coaxial therewith, one end of said helix being connected to the electron drift means disposed between the said first resonator and its neighbor.

6. An ultra high frequency oscillator tube in which a focussed beam of electrons from the electron gun is emitted substantially coaxial with the tube axis, the combination which comprises a slow wave structure coupled to said beam of electrons for producing a high frequency velocity modulated backward wave oscillation, a plurality of mutually independent cavity resonators serially disposed about said velocity modulated beam for amplifying a high frequency oscillation component contained therein; collector electrode means for collecting said beam of electrons independent of said resonators; and means coupled to the last of said plurality of resonators for extracting the high frequency oscillation component.

References Cited by the Examiner

UNITED STATES PATENTS

| | | | |
|---|---|---|---|
| 2,753,481 | 7/1956 | Ettenberg | 315—3.6 |
| 2,824,256 | 2/1958 | Pierce et al. | 315—3.6 X |
| 2,890,373 | 6/1959 | Chodorow | 315—3.6 |
| 2,891,191 | 6/1959 | Heffner et al. | 315—3.6 |
| 2,925,521 | 2/1960 | Dench | 315—3.6 |
| 2,944,183 | 7/1960 | Dreyler | 315—5.46 |
| 2,955,226 | 10/1960 | Currie et al. | 315—3.6 |
| 3,054,015 | 9/1962 | Fujii | 315—3.6 X |

ELI LIEBERMAN, *Primary Examiner.*

GEORGE N. WESTBY, *Examiner.*

S. CHATMON, JR., *Assistant Examiner.*